United States Patent
Yang et al.

(10) Patent No.: US 8,841,782 B2
(45) Date of Patent: Sep. 23, 2014

(54) INTEGRATED CIRCUIT PACKAGE SYSTEM WITH MOLD GATE

(75) Inventors: DaeWook Yang, Pyoungtaek-si (KR); Youngcheol Kim, Youngin-si (KR); Tae Keun Lee, Ichon-si (KR)

(73) Assignee: STATS ChipPAC Ltd., Singapore (SG)

( * ) Notice: Subject to any disclaimer, the term of this patent is extended or adjusted under 35 U.S.C. 154(b) by 1043 days.

(21) Appl. No.: 12/192,042

(22) Filed: Aug. 14, 2008

(65) Prior Publication Data
US 2010/0038804 A1 Feb. 18, 2010

(51) Int. Cl.
*H01L 23/29* (2006.01)
*H01L 23/31* (2006.01)
*H01L 21/56* (2006.01)

(52) U.S. Cl.
CPC ..... *H01L 23/3121* (2013.01); *H01L 2924/0002* (2013.01); *H01L 21/565* (2013.01)
USPC ............. 257/788; 257/E23.116; 438/106

(58) Field of Classification Search
USPC ........... 257/788–796, E23.116; 438/106, 127
See application file for complete search history.

(56) References Cited

U.S. PATENT DOCUMENTS

| | | | |
|---|---|---|---|
| 5,672,908 A * | 9/1997 | Fujitsu | 257/668 |
| 5,731,631 A * | 3/1998 | Yama et al. | 257/702 |
| 5,982,625 A | 11/1999 | Chen et al. | |
| 6,135,757 A | 10/2000 | Jenko | |
| 6,191,360 B1 | 2/2001 | Tao et al. | |
| 6,229,204 B1 * | 5/2001 | Hembree | 257/707 |
| 6,770,961 B2 * | 8/2004 | Lee | 257/687 |
| 6,940,162 B2 * | 9/2005 | Eguchi et al. | 257/723 |
| 7,061,120 B2 * | 6/2006 | Shin et al. | 257/777 |
| 7,109,591 B2 * | 9/2006 | Hack et al. | 257/788 |
| 7,391,104 B1 | 6/2008 | Chang et al. | |
| 7,795,743 B2 * | 9/2010 | Kim et al. | 257/786 |
| 2002/0173073 A1 * | 11/2002 | Liang et al. | 438/107 |
| 2006/0094223 A1 * | 5/2006 | Tsai | 438/612 |
| 2006/0197222 A1 * | 9/2006 | Auerbach et al. | 257/728 |
| 2007/0036944 A1 * | 2/2007 | Auerbach et al. | 428/141 |
| 2009/0189270 A1 * | 7/2009 | Wang | 257/690 |
| 2010/0044889 A1 * | 2/2010 | Amigues et al. | 257/790 |

OTHER PUBLICATIONS

Opila et al (J. Electrochem. Soc., vol. 142, No. 12, Dec. 1995, pp. 4074-4077).*
Opila et al (J.Electrochem. Soc., vol. 142, No. 12. Dec. 1995, pp. 4074-4077).*

* cited by examiner

*Primary Examiner* — Matthew W Such
*Assistant Examiner* — Ali Naraghi
(74) *Attorney, Agent, or Firm* — Ishimaru & Associates LLP

(57) ABSTRACT

An integrated circuit package system includes: providing a substrate; forming a conductive layer over the substrate; forming a mold gate layer having an organic material without polymerization over the conductive layer; and attaching an integrated circuit over the substrate adjacent the mold gate layer.

20 Claims, 3 Drawing Sheets

INTEGRATED CIRCUIT PACKAGE SYSTEM WITH MOLD GATE

TECHNICAL FIELD

The present invention relates generally to integrated circuit package systems and more particularly to a system for integrated circuit package with mold gate.

BACKGROUND ART

Electronic devices can be found in most aspects of modern life. Personal portable devices such as cellular phones, digital cameras, and music players as well as computers, automobiles, and manufacturing systems are some examples. The market for electronic devices or products increasingly demands more functions in reduced dimensions at lower prices.

These high performance products are lighter, faster, smaller, multi-functional, highly reliable, and lower cost. In efforts to meet such requirements, improvements have been attempted in all aspects of electronic product development.

Significant effort has been made in development of new techniques for producing smaller and less expensive semiconductor chips. Unfortunately, this development is still not enough to satisfy the demands. Other efforts involve improving packages for integrated circuit chips.

Numerous semiconductor packaging methodologies have found widespread use. Among those that have been commonly used is the so-called "board-on-chip" arrangement of a substrate relative to a semiconductor die. As its name implies, a substrate, or "board," which provides a connection pattern of input and output elements such as contacts, leads, or other electrodes is positioned on a semiconductor die. Typically, the substrate is positioned on the bond pad such as an input/output electrode bearing surface or "active" surface of the semiconductor die.

In order to provide the desired connection pattern, a substrate typically includes a planar dielectric member, electrical contacts on the die-facing side of the substrate, conductive traces that extend laterally along the dielectric planar member, and redistributed contact pads, or "terminals," that are exposed at the opposite surface of the substrate. A substrate may also include conductive vias that extend through at least a portion of the thickness of the substrate to connect contacts to corresponding conductive traces.

In addition, to facilitate the formation of a molded protective structure, or "package," around the substrate-semiconductor die assembly, the substrate may also include a mold gate. A mold gate is a feature on the substrate, which is configured to communicate with a mold runner through which liquid packaging material is introduced into a mold cavity and to direct the liquid packaging material to desired locations in a desired fashion.

Injection molding is a common manufacturing practice. Various articles such as plastic bottles, toothbrushes, children's toys, as well as integrated circuit chips are made using well-known injection molding techniques generally involves melting a material, which is often plastic, then forcing the melt stream at high temperatures and pressures through one or more gates into a mold cavity.

The melt cools in the shape of the mold cavity, which is opened to eject the finished part. The melt is supplied from a machine nozzle, injected into a heated manifold, and distributed to the mold cavities through heated nozzles. The heated nozzles are seated within bores in a mold plate that forms the mold cavities.

Packaging or encapsulating material is typically introduced over surfaces of the substrate and a semiconductor die thereon from the opposite side or surface of the substrate. As a result, the mold gate is positioned on the opposite side or surface of the substrate from that which carries the conductive traces.

The mold gates of substrates are typically formed by laminating an additional material layer to the surface of the substrate opposite from the conductive trace-bearing surface of the substrate. This additional material layer may be used to form the mold gate itself, or to support a mold gate.

Of course, the requirement of additional material layers over the substrate and thus separately patterned, undesirably increases the cost of fabricating the substrate. Moreover, the use of an additional material layer to form a mold gate may undesirably increase the manufacturing cycle time, which can also increase cost.

Despite the advantages of recent developments in semiconductor fabrication and packaging techniques, there is a continuing need for improving packaging methods, systems, and designs.

Thus, a need still remains for an integrated circuit package system with improved manufacturing processes and materials including mold gates.

In view of the ever-increasing commercial competitive pressures, along with growing consumer expectations and the diminishing opportunities for meaningful product differentiation in the marketplace, it is critical that answers be found for these problems.

Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention includes: providing a substrate; forming a conductive layer over the substrate; forming a mold gate layer having an organic material without polymerization over the conductive layer; and attaching an integrated circuit over the substrate adjacent the mold gate layer.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
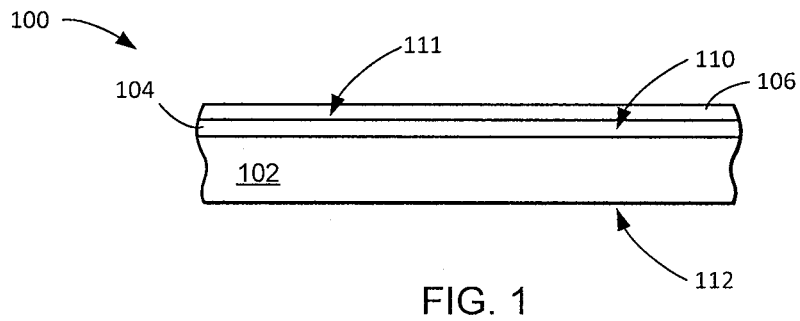
FIG. 1 is a cross-sectional view of an integrated circuit package system along lines 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "upward", "downward", "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
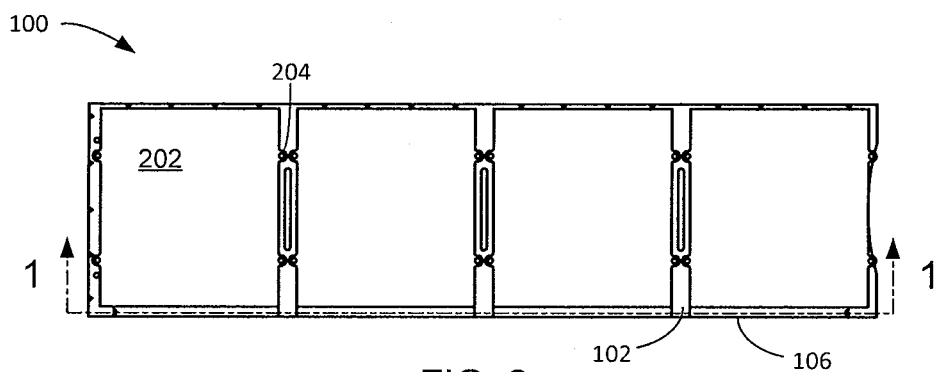
FIG. 2 is a top plan view of the integrated circuit package system in a formation phase.

Referring now to FIG. 1, therein is shown a cross-sectional view of an integrated circuit package system 100 along lines 1-1 of FIG. 2 in a first embodiment of the present invention. The integrated circuit package system 100 preferably includes a substrate 102, a conductive layer 104, and a mold gate layer 106.

The mold gate layer 106 can be formed of an organic material without polymerization as an organic surface protectant or preservative (OSP). The organic material can be formed without thermosetting materials, thermoplastic, poly ink, or other polymer.

The integrated circuit package system 100 can be separated from a compound supply apparatus such as an injector, transfer device, or other material supply device by a process such as degating. The mold gate layer 106 can provide a region for applying or degating mold compounds.

The mold gate layer 106 can be compatible with solder ball mount (SBM) processes resulting in good joint properties based on boundary scan test (BST) data and shear mode. The mold gate layer 106 can provide a boiling or melting point, predetermined for stability of the mold gate layer 106, above two hundred fifty degrees Celsius.

The conductive layer 104 can be formed of any conductive material including metals such as copper. The conductive layer 104 can include a top surface 111, which is a surface of the conductive layer 104 facing opposite to the surface of the conductive layer 104 in direct contact with the substrate 102. The conductive layer 104 can also be formed having the mold gate layer 106 thereover such as a metal finish of copper and organic surface protectant (CuOSP). The mold gate layer 106 is in direct contact with the top surface 111 of the conductive layer 104. The conductive layer 104 can provide electrical connectivity for other components such as solder balls or a next level system.

The substrate 102 can provide structural integrity, a mounting surface, or isolation for components of the integrated circuit package system 100. The substrate 102 can be formed of any material including printed circuit board material.

Components can be mounted over a substrate first side 110. A substrate second side 112 opposite the substrate first side 110 can be substantially exposed. The substrate second side 112 can provide a mounting surface for the integrated circuit package system 100

It has been unexpectedly discovered that the present invention having the substrate 102, the conductive layer 104, and the mold gate layer 106 provides improved manufacturing cycle time and cost effectiveness. The mold gate layer 106 formed of an organic material without polymerization can be formed with existing manufacturing processes and materials without the need for additional steps or layers such as polymers or metals.

Referring now to FIG. 2, therein is shown a top plan view of the integrated circuit package system 100 in a formation phase. The integrated circuit package system 100 preferably includes the substrate 102, the conductive layer 104 of FIG. 1, and the mold gate layer 106.

The substrate 102, the conductive layer 104, and the mold gate layer 106 can be formed as more than one device. Each of the devices can be substantially the same as or different from one another.

An encapsulant 202 such as a mold compound can be applied over the substrate 102 and optionally a portion of the conductive layer 104 or the mold gate layer 106. The encapsulant 202 can provide protection or structural integrity to the integrated circuit package system 100.

The encapsulant 202 can provide a portion of the conductive layer 104 or the mold gate layer 106 exposed. The portion of the mold gate layer 106 can be exposed as a result of processing such as a degating process or mold chase clamping.

Solder bumps (not shown) have been tested with moisture sensitivity level rating three (MSL3), temperature cycling (TC), unbiased highly accelerated stress test (UHAST), high temperature storage (HTS), or combinations thereof. The solder bumps passed tests or combination of tests without issues during solder ball mounting or degating in part based on boundary scan test (BST) or shear mode test.

For illustrative purposes, the integrated circuit package system 100 is shown having four devices in a four by one array although it is understood that any number or configuration of devices may be formed.

Figure 3:
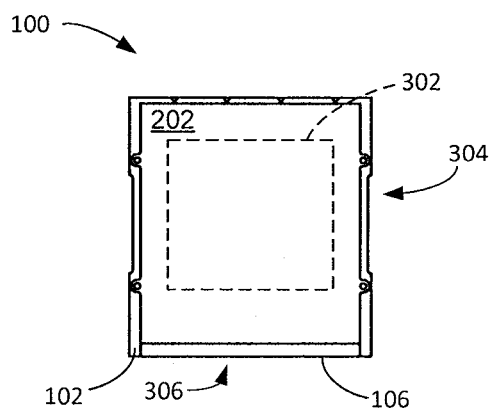
FIG. 3 is a top view of the integrated circuit package system.

Referring now to FIG. 3, therein is shown a top view of the integrated circuit package system 100. The integrated circuit package system 100 preferably includes an integrated circuit 302 over the substrate 102 and adjacent the conductive layer 104 of FIG. 1 or the mold gate layer 106.

The encapsulant 202 can cover and protect the integrated circuit 302 as well as a portion of the substrate 102, the conductive layer 104, or the mold gate layer 106. A portion of a top surface of the mold gate layer 106 can be exposed from the encapsulant 202.

The mold gate layer 106 can provide a region for applying or degating the encapsulant 202. The encapsulant 202 can be applied to a mold chase (not shown) through openings adjacent the mold gate layer 106.

The mold chase can be removed during processing exposing the encapsulant 202 wherein the encapsulant 202 can be separated from the integrated circuit package system 100 and an encapsulant supply apparatus such as an injector, transfer device, or other material supply device. The encapsulant 202 can include an encapsulant protrusion 204 resulting from the mold chase and the encapsulant supply apparatus. The encapsulant protrusion 204 can be on a first side 304 of the encapsulant perpendicular to a second side 306 of the encapsulant with the mold gate layer exposed from the encapsulant.

Separation near the mold gate layer 106 such as degating can be provided by any process including peeling, purging, sanding, or any separation process. The encapsulant 202 can remain or be removed from the mold gate layer 106 as a result of separation.

Referring now to FIGS. 4a to 4e, therein are shown examples of materials preferably used to form the mold gate layer 106 of FIG. 1. The mold gate layer 106 can include an organic material without polymerization such as imidazoles.

A hydrogen bond between hydrogen and nitrogen can provide a boiling point higher than a molecular weight of the mold gate layer 106. A boiling point higher than two hundred fifty degrees Celsius provides strong stability of the mold gate layer 106.

Further, the mold gate layer 106 can be formed of a basic material when bonded with acidic materials such as solvents can form salts due to neutralization reactions.

Figure 4A:
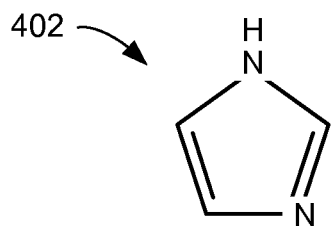
FIGS. 4a to 4e, therein are shown examples of materials preferably used to form the mold gate layer of FIG. 1.

An imidazole structure 402 is shown in FIG. 4a. The imidazole structure 402 can include two nitrogen atoms and a structure with five rings.

Figure 4B:
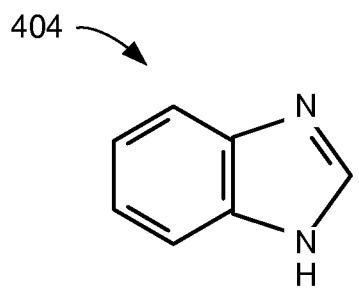

A first organic material without polymerization 404 such as Benzimidazole is shown in FIG. 4b. The first organic material without polymerization 404 can include two nitrogen atoms and a structure with five rings.

Figure 4C:
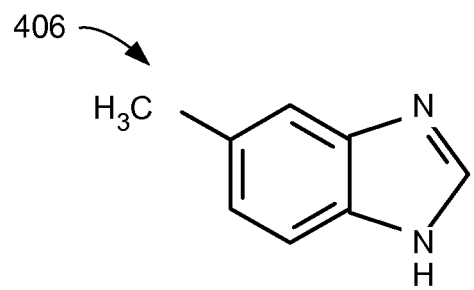

A second organic material without polymerization 406 such as 5-methylbenzimidazole is shown in FIG. 4c. The second organic material without polymerization 406 can be formed by substituting R1-R4 groups.

Figure 4D:
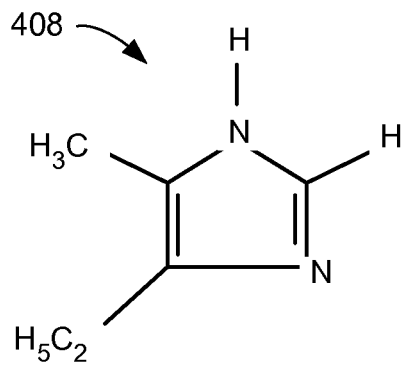

A third organic material without polymerization 408 such as 4-Methyl-5-ethylimidazole is shown in FIG. 4d. The third organic material without polymerization 408 can also be formed by substituting R1-R4 groups.

Figure 4E:
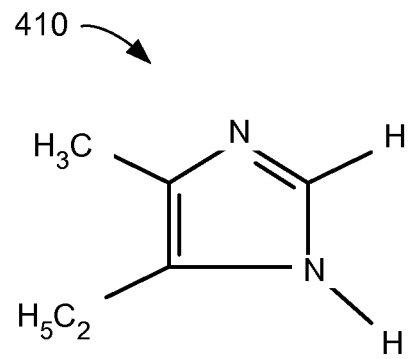

A fourth organic material without polymerization 410 such as 5-Methyl-4-ethylimidazole is shown in FIG. 4e. The fourth organic material without polymerization 410 can also be formed by substituting R1-R4 groups.

Figure 5:
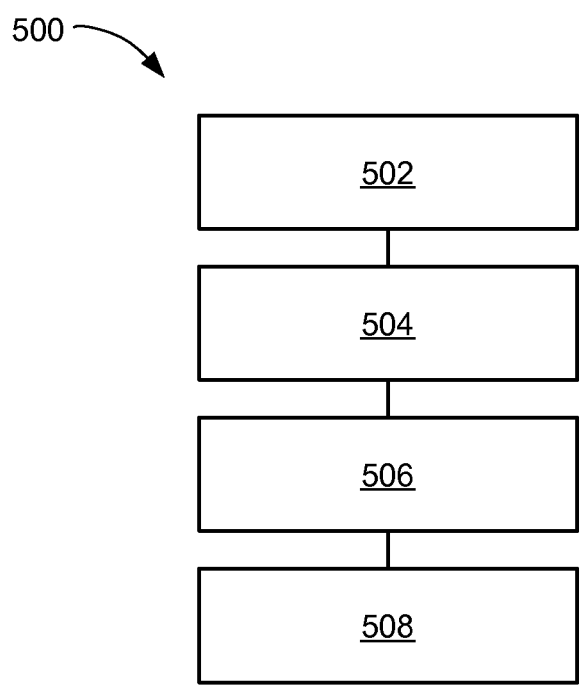
FIG. 5 is a flow chart of an integrated circuit package system for manufacturing the integrated circuit package system in an embodiment of the present invention.

Referring now to FIG. 5, therein is shown a flow chart of an integrated circuit package system 500 for manufacturing the integrated circuit package system 100 in an embodiment of the present invention. The system 500 includes providing a substrate in a block 502; forming a conductive layer over the substrate in a block 504; forming a mold gate layer having an organic material without polymerization over the conductive layer in a block 506; and attaching an integrated circuit over the substrate adjacent the mold gate layer in a block 508.

In greater detail, a system to provide the method and apparatus of the integrated circuit package system 100, in an embodiment of the present invention, is performed as follows:

1. Providing a substrate.
2. Forming a conductive layer over the substrate.
3. Forming a mold gate layer having an organic material without polymerization over the conductive layer.
4. Attaching an integrated circuit over the substrate adjacent the mold gate layer.
5. Applying an encapsulant over the integrated circuit.

Thus, it has been discovered that the integrated circuit package system method and apparatus of the present invention furnish important and heretofore unknown and unavailable solutions, capabilities, and functional aspects.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations, which fall within the scope of the included claims. All matters hitherto set forth herein or shown in the accompanying drawings are to be interpreted in an illustrative and non-limiting sense.

What is claimed is:

1. A method for manufacturing an integrated circuit package system comprising:
   providing a substrate;
   forming a conductive layer over the substrate;
   forming a mold gate layer having an organic material without polymerization in direct contact with a top surface of the conductive layer;
   attaching an integrated circuit over the substrate adjacent the mold gate layer; and
   forming an encapsulant over the integrated circuit, the conductive layer, and the mold gate layer, a portion of a top surface of the mold gate layer exposed from the encapsulant.

2. The method as claimed in claim 1 wherein forming the mold gate layer includes forming an organic material having a hydrogen bond between hydrogen and nitrogen.

3. The method as claimed in claim 1 wherein forming the conductive layer includes forming copper.

4. The method as claimed in claim 1 wherein forming the mold gate layer includes forming the mold gate layer having a melting point predetermined for stability of the mold gate layer.

5. The method as claimed in claim 1 further comprising:
   applying a separation process to the encapsulant.

6. A method for manufacturing an integrated circuit package system comprising:
   providing a substrate;
   forming a conductive layer over the substrate;
   forming a mold gate layer having an organic material without polymerization in direct contact with a top surface of the conductive layer;
   attaching an integrated circuit over the substrate adjacent the mold gate layer; and
   applying an encapsulant over the integrated circuit, the conductive layer, and the mold gate layer, a portion of a top surface of the mold gate layer exposed from the encapsulant.

7. The method as claimed in claim 6 wherein forming the mold gate layer includes forming an imidazole over the conductive layer.

8. The method as claimed in claim 6 wherein forming the mold gate layer includes forming a copper organic surface protectant.

9. The method as claimed in claim 6 wherein forming the mold gate layer includes forming the mold gate layer having a melting point higher than two hundred fifty degrees Celsius.

10. The method as claimed in claim 6 further comprising applying a separation process including degating to the encapsulant.

11. An integrated circuit package system comprising:
a substrate;
a conductive layer over the substrate;
a mold gate layer having an organic material without polymerization in direct contact with a top surfaces of the conductive layer;
an integrated circuit over the substrate adjacent the mold gate layer; and
an encapsulant over the integrated circuit, the conductive layer, and the mold gate layer, a portion of a top surface of the mold gate layer exposed from the encapsulant.

12. The system as claimed in claim 11 wherein the mold gate layer is an organic material having a hydrogen bond between hydrogen and nitrogen.

13. The system as claimed in claim 11 wherein the conductive layer is copper.

14. The system as claimed in claim 11 wherein the mold gate layer has a melting point predetermined for stability of the mold gate layer.

15. The system as claimed in claim 11 wherein the encapsulant is separated.

16. The system as claimed in claim 11 wherein a portion of the substrate is exposed from the encapsulant.

17. The system as claimed in claim 16 wherein the mold gate layer is an imidazole over the conductive layer.

18. The system as claimed in claim 16 wherein the mold gate layer over the conductive layer is a copper organic surface protectant.

19. The system as claimed in claim 16 wherein the mold gate layer has a melting point higher than two hundred fifty degrees Celsius.

20. The system as claimed in claim 16 wherein the encapsulant includes an encapsulant protrusion on a first side of the encapsulant perpendicular to a second side of the encapsulant with the mold gate layer exposed from the encapsulant.

* * * * *

UNITED STATES PATENT AND TRADEMARK OFFICE
CERTIFICATE OF CORRECTION

PATENT NO. : 8,841,782 B2  
APPLICATION NO. : 12/192042  
DATED : September 23, 2014  
INVENTOR(S) : Yang et al.

Page 1 of 1

It is certified that error appears in the above-identified patent and that said Letters Patent is hereby corrected as shown below:

In the Claims:

Column 7, Claim 11, line 14, delete "top surfaces of" and insert therefor --top surface of--

Signed and Sealed this  
Fifth Day of April, 2016

Michelle K. Lee  
*Director of the United States Patent and Trademark Office*